(12) United States Patent
Seddik et al.

(10) Patent No.: US 8,779,651 B2
(45) Date of Patent: Jul. 15, 2014

(54) OPTIMIZED DEVICE FOR CONVERTING MECHANICAL ENERGY INTO ELECTRICAL ENERGY

(75) Inventors: Bouhadjar Ahmed Seddik, Valence (FR); Emmanuel Defay, Voreppa (FR); Ghislain Despesse, Voreppe (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/984,542

(22) PCT Filed: Jan. 31, 2012

(86) PCT No.: PCT/EP2012/051593
§ 371 (c)(1),
(2), (4) Date: Sep. 10, 2013

(87) PCT Pub. No.: WO2012/107327
PCT Pub. Date: Aug. 16, 2012

(65) Prior Publication Data
US 2013/0342075 A1  Dec. 26, 2013

(30) Foreign Application Priority Data
Feb. 11, 2011 (FR) ...................... 11 51156

(51) Int. Cl.
*H01L 41/09* (2006.01)
*H01L 41/113* (2006.01)

(52) U.S. Cl.
CPC ........... *H01L 41/1136* (2013.01); *H01L 41/113* (2013.01)
USPC ...................................................... 310/339

(58) Field of Classification Search
CPC ......................... H01L 41/113; H01L 41/1136
USPC ........................................................... 310/339
See application file for complete search history.

(56) References Cited

U.S. PATENT DOCUMENTS 8,222,754 B1 * 7/2012 Soliman et al. ............... 290/1 R
8,330,334 B2 * 12/2012 Lee et al. ...................... 310/339

(Continued)

FOREIGN PATENT DOCUMENTS

DE 2010041200 A1 * 3/2012 ............ H01L 41/083
EP 2109217 10/2009

(Continued)

OTHER PUBLICATIONS

XP002648345 "DuPont(TM) Teijin Films Mylar(R) MBP Polyester Film, 92 Gauge (32 μm)", MatWeb, Retrieved from the Internet: URL:http://www.matweb.com/search/DataSheet.aspx?MatGUID=fd5659dc8b5242c9bbfb91d79808aff9&ckck=1 (Jul. 7, 2011).

(Continued)

*Primary Examiner* — Thomas Dougherty
(74) *Attorney, Agent, or Firm* — Occhiuti & Rohlicek LLP (57) ABSTRACT

An apparatus for converting vibratory mechanical energy into electrical energy includes a mobile mass, a support, first and second beams, the second being piezoelectric, and a junction element. The first beam extends longitudinally between the support and the mass, each of which has a beam end embedded therein. The second beam links the support and the mobile mass. Its elongation stiffness is lower than that of the first beam. The junction element extends between the beams. A first assembly, with a first bending stiffness, comprises the first beam, the second beam, and the junction element. A second assembly consists of the first assembly minus the second beam. Its bending stiffness is less than or equal to half of that of the first assembly.

14 Claims, 4 Drawing Sheets

(56) References Cited

U.S. PATENT DOCUMENTS

| | | |
|---|---|---|
| 8,373,332 B2 * | 2/2013 | Lee .................................. 310/339 |
| 8,450,909 B2 * | 5/2013 | Lee et al. ........................ 310/339 |
| 8,456,063 B2 * | 6/2013 | Jager et al. ..................... 310/339 |
| 2003/0214200 A1 | 11/2003 | Thompson et al. |
| 2009/0212665 A1 * | 8/2009 | Koser et al. .................... 310/339 |
| 2010/0270889 A1 | 10/2010 | Xu et al. |

FOREIGN PATENT DOCUMENTS

| | | | |
|---|---|---|---|
| WO | WO02/43163 | 5/2002 | |
| WO | WO-2008/150536 A2 * | 12/2008 | .............. G01P 15/09 |
| WO | WO-2012/038223 A1 * | 3/2012 | ............. H01L 41/083 |

OTHER PUBLICATIONS

XP002648346 "Overview of materials for Polyvinylidinefluoride (PVDF), Molded/Extruded", MatWeb Retrieved from the Internet: URL: http://www.matweb.com/search/DataSheet.aspx?MatGUID=a011f8cc f4b448a19246773a32085094 (Jul. 7, 2011).

XP002648347 "Raideur (m~canique)", Wikipedia, Retrieved from the Internet: URL:http://fr.wikipedia.org/wiki/Raideur_%28m%C3%A9canique%29 (Jul. 7, 2011).

XP002648348, "Moment quadratique", Wikipedia, Retrieved from the Internet: URL:http://fr.wikipedia.org/wiki/Moment_quadratique (Jul. 7, 2011).

* cited by examiner

OPTIMIZED DEVICE FOR CONVERTING MECHANICAL ENERGY INTO ELECTRICAL ENERGY

CROSS REFERENCE TO RELATED APPLICATION

This application is the national phase under 35 USC 371 of international application no. PCT/EP2012/051593, filed Jan. 31, 2012, which claims the benefit of the priority date of French application no. 1151156, filed Feb. 11, 2011. The contents of the aforementioned applications are incorporated herein in their entirety.

FIELD OF DISCLOSURE

The invention pertains to devices for converting mechanical energy into electrical energy and especially to independent power supply devices generating electrical energy from a vibratory motion.

BACKGROUND

In certain environments, it may be difficult to connect an electrical circuit to power supply cables, for example in hostile environments or in mechanisms in motion. To overcome this problem, micromechanical devices for converting vibration energy into electrical energy are known. These devices form microsystems generally attached to vibrating supports such as machines or vehicles. One known technique uses a resonant system to amplify a mechanical vibration of a support and convert the amplified motion into electricity. The electrical circuit can thus be powered without using cables coming from the exterior.

One of the known principles for converting mechanical vibration energy into electrical energy is based on the vibratory excitation of a beam provided with piezoelectric elements. Such a beam generally has a core with a first end embedded in a vibrating support. A mobile mass is fixed to the second end of the core. A piezoelectric element is fixed to the upper face of the core and another piezoelectric element is fixed to the lower face of the core. An electrical circuit is connected to the terminals of the piezoelectric elements which are placed electrically in series or in parallel. The core is generally made of a hard material which has a very high quality factor such as steel or silicon. The piezoelectric elements are intended for converting the mechanical energy transmitted by the mobile mass into electrical energy.

During a relative movement between the support and the mobile mass, the force of acceleration of the mobile mass induces a bending moment along the beam. This bending moment is not constant along the beam (the moment being higher at the level of the embedding then at the mass). With a core of constant section throughout its length, the mechanical stress in the upper and lower faces of the core and within the piezoelectric elements is not homogenous throughout their length, this stress being concentrated at the level of the embedding. Nor is the mechanical stress homogenous in the thickness of the core: the greater the distance from the central line (neutral fiber), the greater the mechanical stress. In the case of multilayered cores, the mechanical energy transmitted by the vibrating support towards the core is therefore distributed non-uniformly between the layers.

The use of the piezoelectric elements is limited by a maximum level, not to be exceeded, of mechanical stress which depolarizes these elements. Hence, the non-uniformity of the stress along the length of these piezoelectric elements means that the elements have to be over-sized so that a certain level of stress is not exceeded at any point, even if these elements undergo low stress along the greater part of their length. Consequently, the zones of the piezoelectric elements that undergo lower stress (for example the junction with the mobile mass) turn out to be over-sized. When there is a deformation, these less stressed zones form a parasitic capacitance receiving charges generated in the zones that are under greater stress. The quantity of electrical energy transmitted by the piezoelectric elements to the electrical circuit is thus reduced.

Besides, the piezoelectric elements are used in the longitudinal direction of the beam, corresponding to the direction along which a tensile force and/or a compressive force are applied to them during the bending of the beam. The electrical charges generated are then collected either with electrodes situated at both longitudinal ends of the piezoelectric (polarization of the piezoelectric in the longitudinal direction) or with electrodes placed on the upper and lower faces of the piezoelectric (polarization of the piezoelectric in its transverse direction). For a beam of non-negligible length, the piezoelectric elements must be sized appropriately to prevent the generation of an excessive voltage across their ends/electrodes in order to prevent the formation of electrical arcs on their edges or to avoid reaching their level of depolarizing stress. The zone of the piezoelectric elements generating the greatest amount of electricity is the zone that supports the greatest mechanical stress in proximity to the embedding. Certain conversion devices thus propose to place piezoelectric elements only at the level of the embedding.

In order to homogenize the stress in the piezoelectric elements along the length of the beam, the document drafted by Goldschmidtboeing, Müller and Woias, "*Optimization of Resonant Harvesters in Piezopolymer-Composite Technology*", pages 49-51 of the document distributed at the Power-MEMS Proceedings, 28-29 Nov. 2007, describes a beam-based energy conversion device provided with a silicon core and a piezoelectric element made out of PZT attached to the upper face of the core. The silicon core and the piezoelectric element have a constant thickness but an increasing width between their ends fixed to the mobile mass and their ends fixed to the vibrating support. Thus, the stress in the piezoelectric element is homogenous along the length of the beam.

Besides, the mechanical resonance frequency of a resonance system can be modified by controlling the polarization of the piezoelectric element. The modulus of elasticity (or Young's modulus) of the piezoelectric element can thus be modified actively to modify its stiffness under compressive/tensile force and, consequently, the bending stiffness of the beam and thus influence the mechanical resonance of the resonance system. Thus, an automatic control can be set up over the mechanical resonance frequency of the system. Such automatic control can be necessary when a system from which vibration energy is extracted has variable vibration frequency. An example of such a system is a motor vehicle in which the engine rotation speed or wheel rotation speed undergoes great variations.

Such a matching of the resonance frequency, adapted to the previous example, induces a certain number of problems. The core of the beam is made out of a material having a high quality factor to reduce the mechanical damping of the conversion device but these materials (silicon, steel) generally have a high modulus of elasticity increasing the mechanical energy stored in the substrate to the detriment of the energy stored in the piezoelectric elements, thus reducing the electromechanical coupling of the complete beam and therefore its capacity to modify the resonance frequency of the structure by modification of the electrical polarization of the piezoelectric beams or the electrical load connected to it. In addition, the core is advantageously thicker than the piezoelectric elements in order to prevent the deformation of the beam from causing essentially shear stresses in the piezoelectric element, these shear stresses being unfavorable to the optimal generation of electrical voltage in the piezoelectric element. The core thus has a thickness and a modulus of elasticity that are greater than those of the piezoelectric element. Consequently, the bending stiffness of the beam is essentially defined by the bending stiffness of the core. Since the modulus of elasticity of the piezoelectric element can vary only by about 20%, the variation of the overall bending stiffness of the beam obtained by controlling the polarization of the piezoelectric element is relatively small. Consequently, the mechanical resonance frequency of the conversion device can be controlled only within a limited range. A compromise between the mechanical damping of the beam and the amplitude of its resonance frequency range is therefore necessary.

The document EP2109217 describes a tunable vibratory energy-harvesting device. The energy-harvesting device comprises a beam. The beam is provided with a main body, at least one flap and at least means to modify the shape of the flap. The flap is physically attached to the main body along a longitudinal side of the body. The shape of the flap is modified to modify the stiffness of the structure.

SUMMARY

The invention is aimed at resolving one or more of these drawbacks. The invention thus relates to a device for converting vibratory mechanical energy into electrical energy, comprising:
  a mobile mass;
  a support;
  a first beam extending longitudinally between the support and the mobile mass, the first beam having its ends embedded respectively in the support and in the mobile mass, the first beam having a first elongation stiffness along the longitudinal direction.

The device further comprises:
  a second beam made of piezoelectric material extending longitudinally between the support and the mobile mass, the support and the mobile mass being linked by means of the second beam, the second beam having a second elongation stiffness along the longitudinal direction that is lower than the first stiffness;
  a first junction element extending between the first and second beams, this junction element maintaining the spacing between the first and second beams, the bending stiffness of the assembly that comprises the first beam, the second beam and the junction element being at least twice the bending stiffness of this same assembly devoid of the second beam.

According to one variant, the first junction element comprises a series of protrusions extending between the first beam and the second beam, the protrusions being formed as one piece with the first beam and being separated by hollows.

According to another variant, the first junction element comprises a layer of material joining the first beam to the second beam and having a elongation stiffness smaller than the second elongation stiffness.

According to yet another variant, the first and second beams extend substantially rectilinearly along directions converging inside the mobile mass.

According to yet another variant, the second beam forms an angle of 2° to 4° relative to the first beam.

According to one variant, the mobile mass is kept suspended in a hollow of the support by means of said first and second beams.

According to another variant, the second beam comprises two connection terminals at opposite piezoelectric polarities, the device further comprising an electrical circuit connected between said two connection terminals.

According to yet another variant, the electrical circuit has electrical damping substantially equal to the mechanical damping of a structure including the mobile mass, the first beam, the second beam and the junction element.

According to yet another variant, the electrical circuit has variable impedance, the device further comprising a control circuit capable of modifying the impedance of said electrical circuit.

According to one variant, the electrical circuit has a tunable voltage at its terminals, the device further comprising a control circuit capable of modifying the voltage at the terminals of said electrical circuit.

According to another variant, the piezoelectric material of the second beam is polarized along the longitudinal direction of this beam.

According to yet another variant, the second beam has a succession of piezoelectric elements attached together, two successive piezoelectric elements having opposite polarization values.

According to yet another variant, the device further comprises:
  a third beam made out of piezoelectric material extending longitudinally between the support and the mobile mass, the third beam having its ends embedded respectively in the support and in the mobile mass, the third beam having a third elongation stiffness along the longitudinal direction that is smaller than the first stiffness;
  a second junction element extending between the first and second beams, this junction element maintaining the spacing between the first and third beams, the bending stiffness of the assembly that comprises the first beam, the second beam, the third beam and the junction elements being at least twice the bending stiffness of the same assembly devoid of the second beam.

According to yet another variant, the system comprising the first to third beams, the first and second junction elements and the mobile mass has a longitudinal plane of symmetry such that the second beam is symmetrical to the third beam relative to this plane.

BRIEF DESCRIPTION OF THE FIGURES

Other features and advantages of the invention shall appear more clearly from the following description, given by way of an indication that is in no way exhaustive, with reference to the appended drawings, of which.

DETAILED DESCRIPTION

Figure 1:
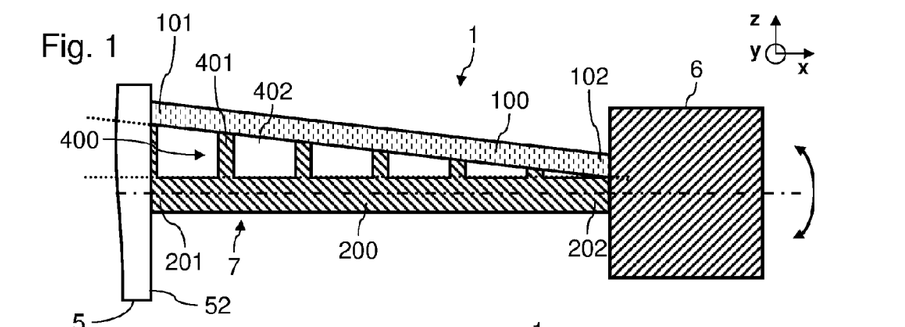
FIG. 1 is a schematic view in longitudinal section of a first embodiment of a device for converting vibratory mechanical energy according to the invention.
Figure 2:
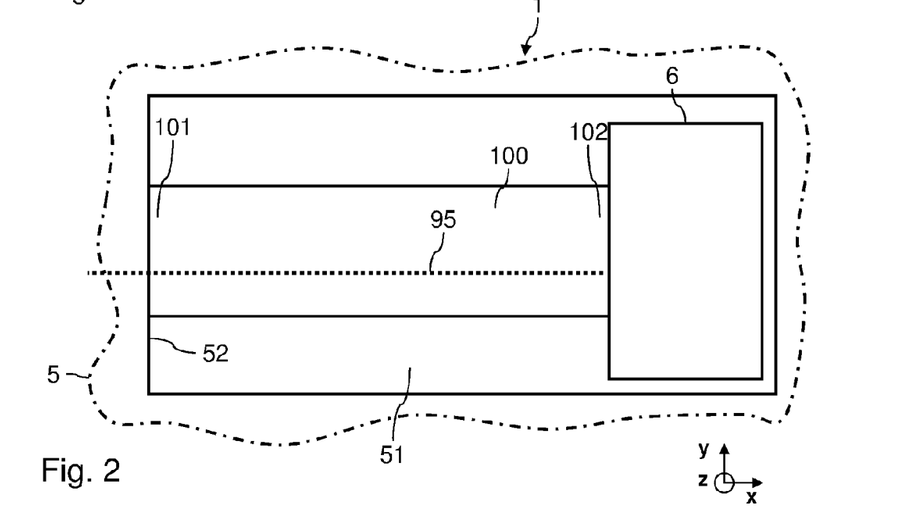
FIG. 2 is a top view of the device of FIG. 1.
Figure 3:
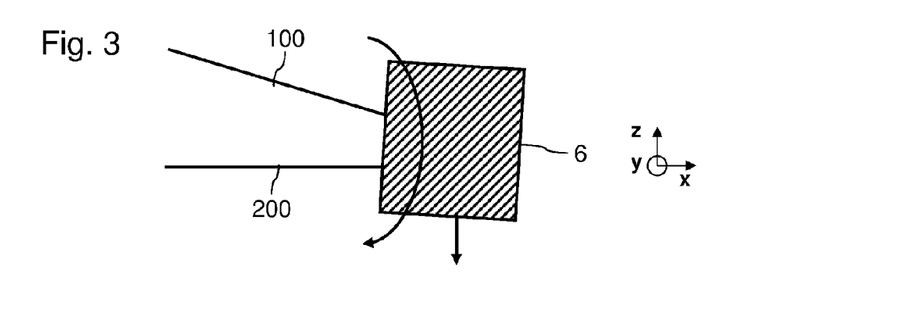
FIG. 3 is a schematic view of the movement of a mobile mass of the device of FIG. 1 during a movement induced by a vibratory excitation.

FIG. 1 is a schematic view in longitudinal section of first embodiment of a device for converting mechanical vibratory energy into electrical energy 1. FIG. 2 is a top view of this same device. The device 1 comprises a support 5 designed to be fixedly joined to the system for generating mechanical vibratory energy. The device 1 also comprises a mobile mass 6, housed in a hollow 51 made in the support 5. A first beam 200 extends longitudinally (along the axis x in the referential system illustrated) between the support 5 and the mobile mass 6. The first beam 200 has two longitudinal ends 201 and 202. The ends 201 and 202 are embedded respectively in the support 5 and in the mobile mass 6. A second beam 100 extends substantially longitudinally between the support 5 and the mobile mass 6. The second beam 100 has two longitudinal ends 101 and 102. The ends 101 and 102 are embedded respectively in the support 5 and in the mobile mass 6. The second beam 100 is made of piezoelectric material. The piezoelectric material has a substantially longitudinal polarization. Thus, a voltage is generated across its ends 101 and 102 when it is subjected to a longitudinal tensile or compressive force. The end 102 is connected to a circuit to be powered and to a resonance frequency control circuit (not shown) by means of electrical wiring 95. The end 101 is connected to the mass of the circuit to be powered and of the control circuit by means of the support 5 formed in a rigid material having a high quality factor. The support 5 can be formed in a semi-conductive substrate. In the example, the longitudinal direction is defined as a direction perpendicular to the face 52 of the support 5 on which the beams 100 and 200 are fixed.

A junction element 400 is placed between the beams 100 and 200. The association of the beams 100, 200 and the junction element 400 form a beam 7. The junction element 400 corresponds to the volume present between the beams 100 and 200 identified by the line of dots and dashes. The junction element 400 extends between the beams 100 and 200. The junction element 400 is configured to keep a spacing between the first and second beams according to the principle of a sandwich structure.

The junction element 400 is configured so that the bending stiffness of the beam 7 around the axis y is at least twice the bending stiffness of this beam 7 devoid of a beam 100. Thus, the beam 100 has a preponderant effect on the bending stiffness of the beam 7. The term "stiffness" or "modulus of bending rigidity" of a beam relative to an axis is defined as the product of the modulus of elasticity of the beam multiplied by its moment of inertia relative to this axis. The relative bending stiffness of two beams could be measured by comparing the bending of each of these beams in the face of a same load applied to their free end (the end intended to be fixed to the mobile mass).

In the example illustrated, the junction element 400 is formed by an alternation of protrusions 401 extending in the direction z and hollows 402. The protrusions 401 are formed as one piece with the beam 200. The beam 100 is fixed to the ends of the protrusions 401, for example by gluing. The presence of the hollows 402 between the protrusions 401 enables the shaping of a junction element 400 having a reduced bending stiffness despite the use of the same material as the beam 200.

The mobile mass 6 is kept suspended by means of the beams 100 and 200 in the hollow 51 made in the support 5. The beams 100 and 200 and the junction element 400 are configured to bend around an axis with a direction y under the effect of the relative motion between the mobile mass 6 and the support 5 along the direction z.

According to the principle of a sandwich structure, the junction element 400 maintains a spacing between the beams 100 and 200, is subjected to shear forces and enables the beams 200 and 100 to be subjected essentially to tensile/compressive forces. The presence of a junction element 400 with smaller bending stiffness between the beams 100 and 200 increases the effect of the modulus of elasticity of the beam 100 on the overall bending stiffness of the beam 7 of the device 1. Thus, if we actively obtain a variation in the modulus of elasticity of the beam 100, it is possible to increase the range of variation of the mechanical resonance frequency of the device 1. Thus, relatively common piezoelectric materials can be used while ensuring a wide range of variation. Besides, the tensile/compressive stresses in the beam 100 are increased for a same force, and this optimizes the harvesting of energy for a given vibration of the support 5. To further increase the effect of the beam 100 on the stiffness of the beam 7, the junction element 400 advantageously has a volume at least equal to the volume occupied by the beams 100 and 200.

The first beam 200 has a stiffness under elongation greater than the stiffness under elongation of the second beam 100 along the longitudinal axis. Thus, the beam 200 ensures a high quality factor for the mechanical resonator formed. The stiffness under elongation of the first beam 200 could especially be obtained by using a material with a high modulus of elasticity such as silicon or steel. The stiffness under elongation of the second beam 100 could especially be obtained by the use of a material having a modulus of elasticity below that of the beam 200, such as PZT or $BaTiO_3$.

The beams 100 and 200 could have appreciably the shape of plates. These plates could for example have a thickness of 10 to 250 μm and could have a length of 5 to 50 mm.

The beam 7 formed by the beams 100 and 200 and the junction element 400 advantageously has a bending stiffness around the axis z appreciably greater than the bending stiffness around the axis y.

Advantageously, the beams 100 and 200 are substantially rectilinear or plane and extend along directions converging within the mobile mass. Advantageously, the beams 100 and 200 extend in directions converging at the centre of gravity of the mobile mass 6.

Advantageously, the mobile mass 6 has a mass appreciably greater than the mass of the beam 7 formed by the beams 100 and 200 and the junction element 400. Thus, the mechanical resonance frequency can be fixed more easily in a restricted volume and the essential part of the mass undergoes a maximum movement making it possible to increase the associated kinetic energy and therefore the harvested electrical power.

Advantageously, the support 5, the mobile mass 6, the beam 200 and the protrusions 401 of the linking element are formed as one piece, for example in a silicon substrate. Such a configuration can be obtained easily according to prior-art techniques for shaping silicon, in making it possible to obtain appropriate modulus-of-elasticity values for a conversion device according to the invention.

Advantageously, the beam 100 is inclined relative to the beam 200 and inclined relative to the perpendicular to the face 52. Through an appropriate inclination of the beam 100, an example of the determining of which is given here below, a bending of the beam 7 leads to substantially homogenous tensile/compressive stresses in the beam 100. Thus, the moment of inertia of the beam increases as and when the distance from the mobile mass 6 increases. A homogenous distribution of stresses in the length of the beam 100 makes it possible to benefit from an optimum sizing of this beam and to optimize both the energy harvesting during the deformation because of the absence of less stressed zones forming parasitic capacitances and the effect of the stiffness of the beam 100 on the beam 7.

The control circuit for controlling the resonance frequency comprises an electrical with tunable impendence. Depending on the mechanical resonance frequency desired, the control circuit adapts the impendence connected to the terminals of the piezoelectric beam 100. A maximum impedance (for example an open circuit) at the terminals of the piezoelectric beam 100 defines a maximum mechanical resonance frequency while a minimum impedance (for example a short circuit) at the terminals of the piezoelectric beam 100 defines a minimum mechanical resonance frequency.

The control circuit advantageously defines the mechanical resonance frequency so that it is close to the frequency of the vibration of the support 5 and/or adapts the electrical damping factor of the electrical circuit connected to the terminals of the beam 100 so that this damping factor is substantially equal to the mechanical damping factor.

Figure 4:
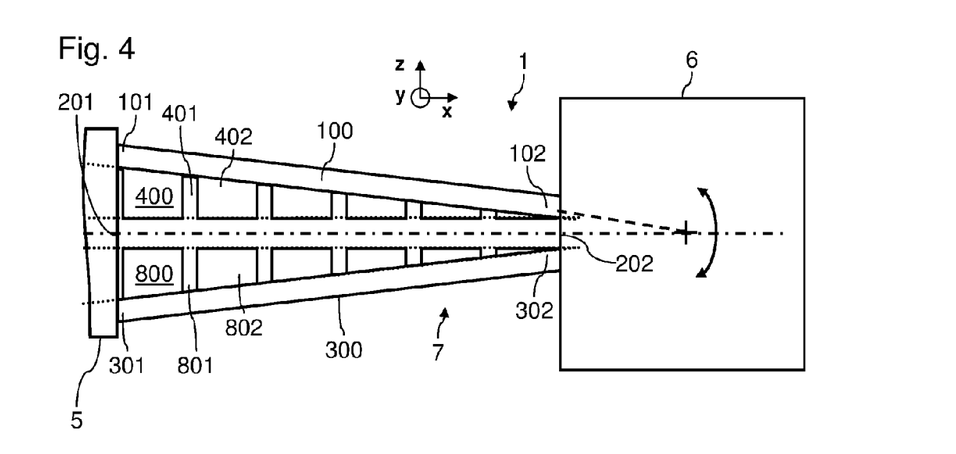
FIG. 4 is a schematic view in longitudinal section of a second embodiment of a device for converting vibratory mechanical energy according to the invention.

FIG. 4 is a schematic view in longitudinal section of a second embodiment of a device for converting vibratory mechanical energy into electrical energy 1. As in the previous embodiment, the device 1 comprises a support 5 and a mobile mass 6 housed in a hollow of the support 5. A first beam 200, a second beam 100 and a third beam 300 extend longitudinally between the support 5 and the mobile mass 6. The beams 100, 200 and 300 have respective ends 101, 201, 301 embedded in the support 5 and respective ends 102, 202, 302 embedded in the mobile mass 6. The beams 100 and 300 are made out of piezoelectric material. The piezoelectric material has a substantially longitudinal polarization. Thus, voltage is generated across the ends 101 and 102 or 301 and 302 when the beams 100 or 300 are subjected to a longitudinal tensile or compressive force. The ends of the beams 100 and 300 are connected appropriately to a circuit to be powered and to a resonance frequency control circuit.

A junction element 400 is placed between the beams 100 and 200. Similarly, a junction element 800 is placed between the beams 200 and 300. The association of the beams 100, 200, 300 and junction elements 400 and 800 forms a beam 7. The beam 7 thus formed has a longitudinal plane of symmetry (x, y). A plane of symmetry enables the ends of the beams to be electrically connected together. Since the amplitude of the tensile force in one beam is close to the amplitude of the compressive force in the other beam during a bending, the stresses generated on the beams 100 and 200 are similar in amplitude (opposite in sign but that can be compensated for by reversing the sense of the piezoelectric polarization of one beam relative to the other). The junction element 400 corresponds to the volume present between the beams 100 and 200 and the junction element 800 corresponds to the volume present between the beams 200 and 300. These volumes are identified by lines of dots and dashes. The junction element 400 extends between the beams 100 and 200. The junction element 800 extends between the beams 200 and 300. The junction element 400 is configured to maintain a spacing between the first and second beams 200 and 100. Similarly, the junction element 800 is configured to maintain a spacing between the first and third beams 200 and 300. The junction elements 400 and 800 are configured so that the bending stiffness of the beam 7 around the axis y is at least twice the bending stiffness of this beam 7 devoid of any beam 100 or beam 300. Thus, the beam 100 and the beam 300 have a preponderant effect on the bending stiffness of the beam 7.

The junction elements 400 and 800 are formed by an alternation of respective protrusions 401 and 801 extending in the direction z and respective hollows 402, 802. In this example, the hollows 402 and 802 have a rectangular trapezoid section. The protrusions 401 and 801 are formed as one piece with the beam 200. The beam 100 is fixed to the end of the protrusions 401, for example by gluing. Similarly, the beam 300 is fixed to the ends of the protrusions 801.

The mobile mass 6 is kept suspended by means of the beam 7 in the hollow made in the support 5. The beam 7 is configured to bend around an axis of direction y under the effect of the relative motion between the mobile mass 6 and the support 5 in the direction z.

Because of the symmetry of the beam 7 during the moving of the mobile mass 6 and the bending of the beam 7, the neutral fiber of the beam 7 is situated inside the beam 200. Thus, the beam 200 is subjected to tensile/compressive stresses that are reduced during a bending of the beam 7, these tensile/compressive stresses being concentrated in the beams 100 and 300. The energy harvesting and the effect of a variation of stiffness of these beams 100 and 300 on the resonance frequency are thus optimized.

The first beam 200 has an elongation stiffness along the longitudinal direction greater than the elongation stiffness of the beams 100 and 300 in the longitudinal direction. The beam 200 has a high modulus of elasticity providing a high quality factor for the mechanical resonator formed. The first beam 200 could be formed out of a material such as silicon or steel having a modulus of elasticity greater than 100 GPa. The beams 100 and 300 could especially be formed out of materials such as PZT and $BaTiO_3$. The beams 100, 200 and 300 could be substantially plate-shaped. These plates could for example have a thickness ranging from 50 to 250 μm and could have a length of 5 to 50 mm.

The difference in stiffness between the beam 200 and the beams 100 and 300 can be adjusted in order to protect the piezoelectric beams 100 and 300 against a stress greater than their depolarization threshold by limiting the pivoting of the mobile mass 6 about an axis y during its movement along the axis z.

The beam 7 advantageously has a bending stiffness about the axis z that is appreciably greater than the bending stiffness about the axis y. Advantageously, the beams 100, 200 and 300 are appreciably rectilinear or plane and extend in directions converging inside the mobile mass, preferably at the centre of gravity of the mobile materials 6. Advantageously, the mobile mass 6 has a mass appreciably greater than the mass of the beam 7. Advantageously, the support 5, the mobile mass 6, the beam 200 and the protrusions 401 and 801 are formed as one piece, for example in a silicon or steel substrate.

Advantageously, the beams 100 and 300 are inclined relative to the beam 200 and inclined relative to the direction x. Through an appropriate inclination of the beams 100 and 300, a bending of the beam 7 causes substantially homogenous tensile/compressive stresses in these beams 100 and 300.

The resonance frequency control circuit comprises an electrical load with tunable impedance. Depending on the desired mechanical resonance frequency, the control circuit matches the impedance connected to the terminals of the piezoelectric beams 100 and 300. A maximum impedance at the terminals of the piezoelectric beam 100 defines a maximum mechanical resonance frequency while a maximum impedance at the terminals of the piezoelectric beams 100 and 300 defines a minimum mechanical resonance frequency.

The tuning of the resonance frequency can also be obtained by applying a voltage to the terminals of the piezoelectric beams 100 and 300. This voltage has the effect of modifying the modulus of elasticity of the piezoelectric material as well as creating mechanical tensile/compressive stresses in the different beams: if the piezoelectric beams 100 and 300 elongate under the effect of a voltage, this elongation will tend to stretch the central beam 200 which, by a counter reaction, will cause a compressive stress in the piezoelectric beams 100 and 300. These tensile/compressive stresses can, through the non-linearity of the materials, cause a change in the resonance frequency of the beam 7.

It is thus possible to harvest energy while at the same time imposing an average tuning voltage. Indeed, the average stiffness of the structure will be linked to the average value of the voltage at the terminals of the piezoelectric materials. This average voltage value can then be adjusted either by injecting a given quantity of electrical charges into the piezoelectric beam or through a variable voltage source connected to the piezoelectric beam by a high-value resistance. Such a resistance forms a low-pass filter with the capacitance of the piezoelectric beams. The cut-off frequency of this low-pass filter is lower than the vibration frequency so that the vibration can induce a superimposition of an alternating current component with this direct current component. The energy of this alternating current component can then be harvested, either through a linking capacitance which brings it to around zero volts and which can then be rectified and converted into a voltage/current that can be used by the application or by another method adapted to the specific features of the requirements of the application.

Figure 5:
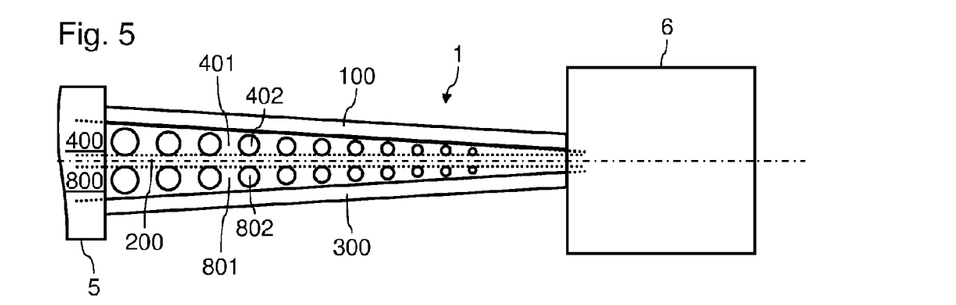
FIGS. 5 to 7 are schematic views in longitudinal section of a variants of the embodiment of FIG. 4.

FIG. 5 is a schematic view in longitudinal section of an alternative of the second embodiment of a conversion device 1. This variant is distinguished from the variant of FIG. 4 by circular-sectioned hollows 402 and 802.

Figure 6:
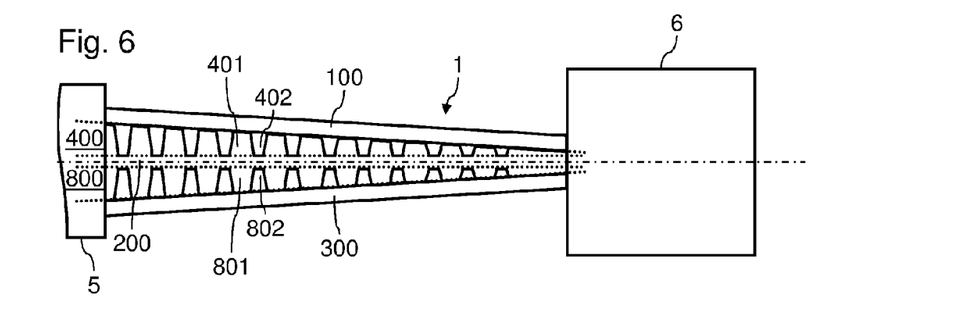

FIG. 6 is a schematic view in longitudinal section of another variant of the second embodiment of a conversion device 1. This variant can be distinguished from the variant of FIG. 4 by hollows 402 and 802 with a quadrilateral-shaped section whose sides diverge in moving away from the beam 200.

Figure 7:
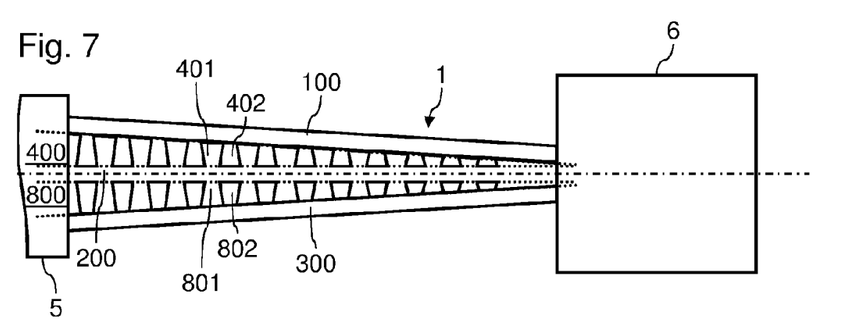

FIG. 7 is a schematic view in longitudinal section of yet another variant of the second embodiment of a conversion device 1. This variant can be distinguished from the variant of FIG. 4 by a hollows 402 and 802 with a quadrilateral-shaped section whose sides converge in moving away from the beam 200.

Figure 8:
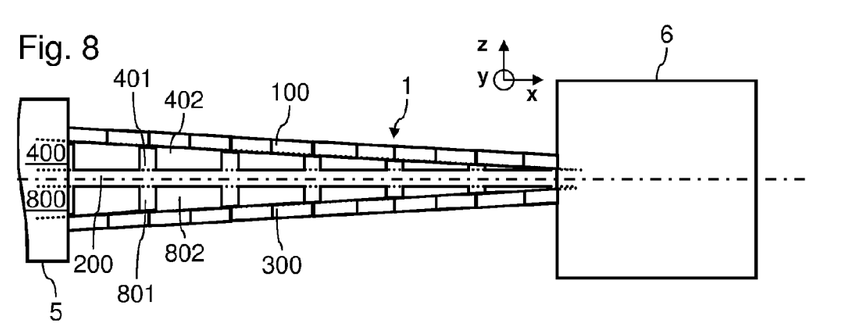
FIG. 8 is a schematic view in longitudinal section of a third embodiment of a device for converting vibratory mechanical energy according to the invention.
Figure 9:
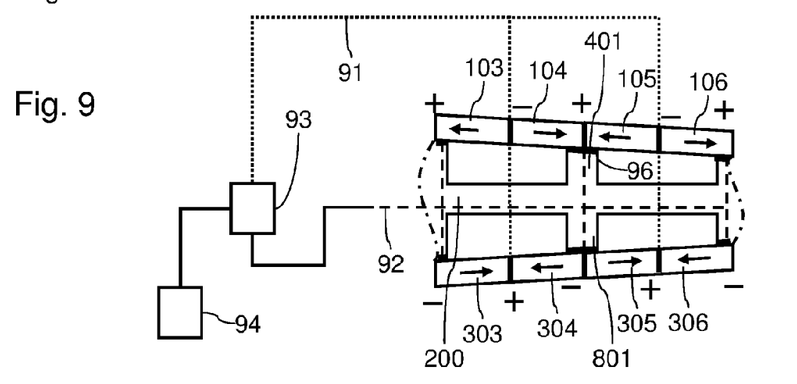
FIG. 9 is a magnified view of the device for converting mechanical energy of FIG. 8 illustrating its connections with an electrical circuit.

FIG. 8 is a schematic view in longitudinal section of a third embodiment of a device for converting vibratory mechanical energy into electrical energy 1. FIG. 9 is a partial representation view of this embodiment and of its connections with electrical circuits. This device 1 differs from the second embodiment by the structure of the beams 100 and 300. In this embodiment, the beams 100 and 300 are formed by the assembling of a longitudinal succession of piezoelectric components. The piezoelectric components of the beams 100 and 300 have a polarization oriented along the respective axis of these beams 100 and 300. Two successive piezoelectric components have an opposite polarization. Each piezoelectric component of the beam 100 has a polarization opposite to the polarization of the piezoelectric component plumb with it on the beam 300 (at the same longitudinal level). The successive piezoelectric components of a same beam 100 or 300 are assembled together by means of a glue so that they can transmit tensile and compressive forces between each other. Each piezoelectric component has one end fixed to a protrusion of a junction element and one end plumb with a hollow of this same junction element. In this example, the piezoelectric components 103, 104, 105 and 106 have their end having polarity fixed to protrusions and their end having negative polarity fixed plumb with hollows. The piezoelectric components 303, 304, 305 and 306 have their end with negative polarity fixed to protrusions and their end with positive polarity fixed plumb with hollows.

The piezoelectric components are fixed to the protrusions of the junction elements 400 and 800 by means of a conductive glue 96, for example the same glue as the one used to assemble the successive piezoelectric components. The ends with positive polarity of the components of the beam 100 are connected to the ends with negative polarity of the components of the beam 300. This opposition of polarity is not harmful inasmuch as a bending simultaneously induces tensile force in one piezoelectric beam and a compressive force substantially of the same amplitude in the other piezoelectric beam. The ends of the piezoelectric components connected together are therefore appreciably at the same potential. The ends of the piezoelectric components fixed to said protrusions can be connected electrically to an electrical conductor 92 by means of tracks made in the protrusions 401, 801 and the beam 200 or directly by conduction through these protrusions 401, 801 and the beam 200 (made for example of conductively doped silicon or steel). The ends of the piezoelectric components fixed plumb with the hollows are connected electrically to an electric conductor 91 by means of appropriate wiring. The electrical conductors 91 and 92 are connected to respective terminals of a circuit 93 intended both to be powered by the deformation of the beams 100 and 300 and to control the stiffness of these beams 100 and 300 by means of a variable impedance or a polarization voltage. A control circuit 94 is connected to the circuit 93 in order to define the impedance of this circuit 93 and to dictate a polarization voltage and thus define the mechanical resonance frequency of the device 1.

This embodiment reduces the maximum voltage generated by the beams 100 and 300, this voltage being proportional to the length of a piezoelectric element in the sense of its polarization and thus prevents a possible electric arc. This embodiment also increases the overall capacitance of the conversion device 1. The length of the beams 100 and 300 being divided into N piezoelectric elements, the capacitance of each element is multiplied by N and if the N elements are placed electrically in parallel, the overall capacitance connected to the electrical load is also multiplied by N and all the parasitic capacitances of the electrical circuit and of the connections are made even more negligible. This embodiment is particularly advantageous when the beams 100 and 300 have an optimal inclination ensuring homogeneity of stress during the bending of the beam 7. The ends of the different piezoelectric components can then be connected together without undergoing any harmful effect from less stressed piezoelectric components forming parasitic capacitances.

Figure 10:
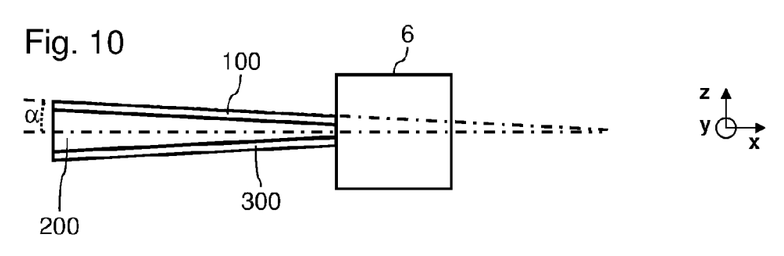
FIG. 10 is a schematic view of a model of a device for converting vibratory mechanical energy to determine an optimal angle of inclination of a piezoelectric beam.

FIG. 10 is a side view of a simplified model of a conversion device used to determine the optimal angle of inclination α of the piezoelectric beams in order to obtain homogeneity of stresses during bending. The modeling is done with a solid beam 200 joining the beams 100 and 300, and beams 100 and 300 of constant thickness.

The mobile mass 6 of the example is made of steel and has the following sizes: length 20 mm, width 20 mm, height 20 mm.

The beam 200 is made of steel and has the following dimensions: length 50 mm, width 20 mm and thickness ranging from 0.78 to 6 mm.

The beams 100 and 300 have a modulus of elasticity of 62 GPa, density of 7.85, relative permittivity of 880 and piezoelectric coefficient of $2.95 \cdot 10^{-9}$ C/N. The beams 100 and 300 have the following dimensions: a length of 50 mm, width 10 mm and thickness 1 mm.

Figure 11:
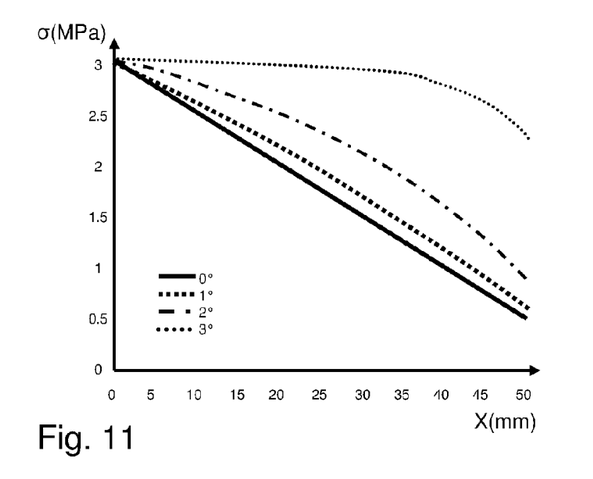
FIG. 11 is a graph illustrating the tensile/compressive stress in the piezoelectric beam of the model of FIG. 10, according to the longitudinal location at which this stress is measured.

The graph of FIG. 11 illustrates a distribution of tensile and compressive stresses on the surface of a piezoelectric beam 100 or 300 during the application of a same bending value. The value X corresponds to the distance of the mobile mass at which the stress is measured. As illustrated in the graph, it can be seen that the stress in the piezoelectric beam is substantially homogenous for an angle $\alpha$ of 3°. Thus, advantageously, the beams 100 and 300 that are used will be beams forming an angle of 2° to 4° relative to the beam 200.

In the examples illustrated, the polarization of the piezoelectric beams is longitudinal. However, it is also possible to envisage the use of piezoelectric beams in which the polarization the direction of their thickness. Such polarization however limits the variation of stiffness possible for piezoelectric beams and, thus, the range of variation of the mechanical resonance frequency. Such polarization however makes it possible to have a greater electrical capacitance, thus limiting the effect of the parasitic capacitances. Such polarization also limits the voltage in the piezoelectric beams to limit the risks of dielectric disruption from the exterior.

In the examples illustrated, the bending stiffness of the junction elements 400 and 800 is reduced by means of hollows made in a material with a high quality factor. However, the invention can also be implemented by using junction elements 400 or 800 comprising a layer of continuous material having a modulus of elasticity far lower than the modulus of elasticity of the beam 100. It is also possible to no longer take account of the electrodes of the piezoelectric beams that can be made out of a material with a high Young's modulus (tungsten, platinum, etc) but with a thickness so small (<1 µm) that their contribution to the overall bending stiffness can be considered to be negligible

The invention claimed is:

1. An apparatus for converting vibratory mechanical energy into electrical energy, said apparatus comprising a mobile mass, a support, a first beam, a second beam, and a first junction element, wherein said first beam extends longitudinally between said support and said mobile mass, wherein said first beam has a first end embedded in said support and a second end embedded in said mobile mass, wherein said first beam has a first elongation stiffness along a longitudinal direction thereof, wherein said second beam is made of piezoelectric material, wherein said second beam extends along a longitudinal direction between said support and said mobile mass, wherein said second beam links said support and said mobile mass, wherein said second beam has a second elongation stiffness along said longitudinal direction that is lower than said first elongation stiffness, wherein said first junction element extends between said first and second beams, wherein said first junction element maintains a spacing between said first beam and said second beam, wherein a first assembly comprises said first beam, said second beam, and said first junction element, wherein said first assembly has a first bending stiffness, wherein a second assembly consists of said first assembly with said second beam excluded therefrom, wherein said second assembly has a second bending stiffness, and wherein said first bending stiffness is at least double said second bending stiffness.

2. The apparatus of claim 1, wherein said first junction element comprises a series of protrusions extending between said first beam and said second beam, said protrusions being formed as one piece with said first beam and being separated from each other by hollows.

3. The apparatus of claim 1, wherein said first junction element comprises a layer of material joining said first beam to said second beam, said layer of material having an elongation stiffness that is less than said second elongation stiffness.

4. The apparatus of claim 1, wherein said first beam and said second beam extend substantially rectilinearly along directions that converge inside said mobile mass.

5. The apparatus of claim 4, wherein said second beam forms an angle of between two degrees and four degrees relative to said first beam.

6. The apparatus of claim 1, wherein said first beam and said second beam suspend said mobile mass in a hollow of said support.

7. The apparatus of claim 1, wherein said second beam comprises a first connection terminal and a second connection terminal, wherein said first connection terminal has a first piezoelectric polarity, wherein said second connection terminal has a second piezoelectric polarity, wherein said first piezoelectric polarity is opposite to said second piezoelectric polarity, and wherein said apparatus further comprises an electrical circuit connected between said first connection terminal and said second connection terminal.

8. The apparatus of claim 7, wherein said electrical circuit has electrical damping substantially equal to mechanical damping of a structure that includes said mobile mass, said first beam, said second beam, and said first junction element.

9. The apparatus of claim 7, wherein said electrical circuit has variable impedance, and wherein said apparatus further comprises a control circuit configured to modify said variable impedance of said electrical circuit.

10. The apparatus of claim 7, wherein said electrical circuit has a tunable voltage at terminals thereof, and wherein said apparatus further comprises a control circuit configured to vary said tunable voltage at said terminals of said electrical circuit.

11. The apparatus of claim 1, wherein said piezoelectric material of which said second beam is made is polarized along said longitudinal direction along which said second beam extends.

12. The apparatus of claim 11, wherein said second beam comprises a succession of piezoelectric elements attached together, wherein two successive piezoelectric elements of said succession have opposite polarization values.

13. The apparatus of claim 1, further comprising a third beam and a second junction element, wherein said third beam is made out of piezoelectric material, wherein said third beam extends longitudinally between said support and said mobile mass, wherein said third beam has a first end embedded in said support, wherein said third beam has a second end embedded in said mobile mass, wherein said third beam has a third elongation stiffness along said longitudinal direction, wherein said third elongation stiffness is smaller than said first elongation stiffness, wherein said second junction element extends between said first beam and said second beam, wherein said second junction element maintains spacing between said first beam and said third beam, wherein a third assembly comprises said first beam, said second beam, said third beam, said first junction element, and said second junction element, wherein a fourth assembly consists of said third assembly with said second beam removed therefrom, wherein said third assembly has a third bending stiffness, wherein said fourth assembly has a fourth bending stiffness, and wherein third bending stiffness is at least twice said fourth bending stiffness.

14. The apparatus of claim 13, wherein a system that comprises said first beam, said second beam, said third beam, said first junction element, said second junction element, and said mobile mass has a longitudinal plane of symmetry such that said second beam is symmetrical to said third beam relative to said longitudinal plane of symmetry.

* * * * *